United States Patent [19]

Volkert et al.

[11] 3,770,435

[45] Nov. 6, 1973

[54] PRODUCTION OF GRAVURE PRINTING PLATES BASED ON PLASTICS MATERIALS

[75] Inventors: Otto Volkert, Ludwigshafen; Manfred Zuerger, Mannheim, both of Germany

[73] Assignee: Badische Anilin- & Soda-Fabrik Aktiengesellschaft, Ludwigshafen/Rhine, Germany

[22] Filed: Dec. 8, 1971

[21] Appl. No.: 205,857

[52] U.S. Cl. .......... 96/45, 96/35.1, 96/38

[51] Int. Cl. .......... G03f 5/00, G03f 7/00

[58] Field of Search .......... 96/35.1, 45, 38, 96/86 P

[56] References Cited

UNITED STATES PATENTS

| | | | |
|---|---|---|---|
| 2,149,846 | 3/1939 | Johnson | 96/35 |
| 1,464,140 | 8/1923 | Sauer | 96/38 |
| 2,165,407 | 7/1939 | Murray | 96/45 |
| 2,532,701 | 12/1950 | Falconer | 96/38 |
| 2,628,903 | 2/1953 | Kott | 96/45 |
| 2,914,406 | 11/1959 | Consaul | 96/45 |
| 2,912,327 | 11/1959 | Maurer | 96/45 |
| 3,129,099 | 4/1964 | Consaul | 96/45 |
| 3,154,415 | 10/1964 | Kaulen | 96/38 |

*Primary Examiner*—Norman G. Torchin
*Assistant Examiner*—Alfonso T. Suro Pico
*Attorney*—Johnston, Root, O'Keeffe, Keil, Thompson & Shurtleff

[57] ABSTRACT

A process for the production of gravure printing plates by exposing through a continuous tone positive a layer of a photocrosslinkable material that is soluble in a developer solution but which becomes sparingly soluble or insoluble in said solution after exposure, which layer has been applied to a dimensionally stable substrate, subsequently laminating the exposed layer to a base so that the side originally facing the positive faces the base, re-exposing said laminated layer through a screen and washing out the non-crosslinked areas with the developer solution from the rear side.

Tonally correct gravure printing plates based on plastics materials can be advantageously obtained by the process of the invention.

8 Claims, 4 Drawing Figures

PRODUCTION OF GRAVURE PRINTING PLATES BASED ON PLASTICS MATERIALS

Figure 1:
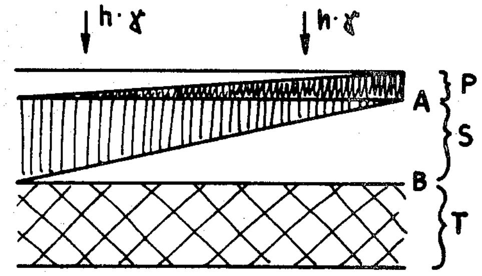
Figure 2:
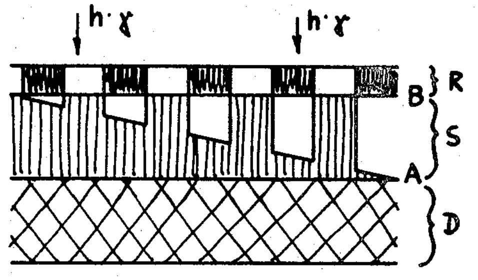

This invention relates to a process for the production of gravure printing plates based on plastics materials.

In intaglio printing the printing areas comprise a large number of wells from which the ink is transferred to the paper. The tone values of an image depend on the amount of ink transferred and consequently on the volume of the wells. There are two types of intaglio printing: intaglio half-tone in which the tone values of the image are controlled by varying the area of the wells which have a constant depth, and conventional gravure in which the tone values are controlled by varying the depth of the wells which have a constant area. Of the two, conventional gravure has found much wider acceptance. It has the disadvantage that the production of the printing plate is both complicated and time-consuming. The image to be printed is first copied on emulsion-coated paper which is then applied to the cylinder and developed, and the cylinder is then etched to varying depths with an iron salt solution which breaks through the gelatin emulsion gradually, depending on the degree of hardening, and after breaking through etches the plate. The considerable time these steps take, the varying quality of the emulsion-coated paper and the etching process which is difficult to standardize are big disadvantages of this method of manufacturing printing plates, U.K. Pat. No. 875,377 describes a gravure printing process in which the printing surface on the plate cylinder is made of plastics material and not of metal. In this process the varying depths of the wells are obtained by exposing a photopolymerizable layer through a continuous tone positive together with a half-tone screen. The transparent portions of the continuous tone positive let through strong light varying in intensity which scatters in the photopolymerizable layer beneath the opaque areas of the half-tone screen positive, photoinsolubilizes the material to varying degrees depending on the tone values of the positive and consequently determines the depths of the wells. This process has the disadvantage that this light scattering in the polymeric material can only be reproduced with great difficulty. Moreover, it is not possible during exposure, owing to the constant presence of oxygen at the surface of the photopolymer layer, to completely polymerize those portions of the layer beneath the completely transparent areas of the positive, as is necessary for the printing process.

It is an object of the present invention to provide an advantageous process for the production of gravure printing plates based on plastics materials, the depths of the wells being proportional to the optical density of the positive.

We have found that the production of gravure printing plates by exposing through a continuous-tone positive and a screen grid a layer of a preferably solid photocrosslinkable material which is soluble in a developer solution but which becomes sparingly soluble or insoluble in said developer solution after exposure, which layer has been applied to a dimensionally stable substrate, and then washing out the unexposed areas with said developer solution can be advantageously carried out by exposing the photocrosslinkable layer S through the continuous tone positive P until the photocrosslinkable material beneath the completely transparent areas of the positive is corsslinked through to the substrate T, subsequently laminating the layer S to a base D so that the front side A originally facing the positive faces the base, re-exposing the layer S from the rear side B, if necessary after removal of the substrate T, through a screen grid R to give the network of doctor lines, and then washing out the non-crosslinked areas of the layer S from the rear side B with the developer solution.

We have also found that particularly good gravure printing plates can be obtained by the process of the invention when the photocrosslinkable layer S contains, finely dispersed therein, 0.05 to 20 percent by weight of actinic-light-absorbing compounds which do not disturb the photopolymerization reaction in order to obtain a favorable optical density in the layer.

We have further found that gravure printing plates can be advantageously prepared and at the same time that the need for a large number of cylinders of varying diameter can be substantially met by exposing through a continuous tone positive P a photocrosslinkable layer S to which there has been firmly bonded an approximately 5 to 100 μ thick, light-transmitting upper layer U of plastics material that is insoluble in the developer solution or has been insolubilized, from front side A through layer U and laminating the firmly adhering alyers S and U to a base D, which may be provided with a layer of adhesive, so that the upper layer U originally facing the positive faces the base.

We have found that the said need can also be met by providing the base D, prior to lamination of layer S or layers S and U which have been exposed through the continuous tone positive, with an approximately 5 to 500 μ thick layer U' of plastics material which is insoluble in the developer solution or has been insolubilized and which can be firmly bonded to layer S or upper layer U. Particularly good results are obtained when both layer U and layer U' are used.

By gravure printing plates we mean plates, films or cylinders of which the image-forming portions carrying the printing ink are in the form of wells.

These printing plates are prepared for printing by the application of printing ink and removal of excess ink from the surface by means of a doctor blade. The ink remaining in the wells is then transferred to the paper to be printed when it comes into contact therewith. For the guidance of the doctor blade along the printing plane, the printing plate is provided with a criss-cross pattern of lines which break the image up into individual elements referred to as "wells." In this way the doctor blade is prevented from descending into the etched areas and removing ink therefrom. In the conventional gravure printing process, the amount of ink transferred to the material being printed depends on the depths to which the wells have been etched, by which means the gradations in the continuous tone transparencies may be reproduced. The ratio of line width to well width in the case of a squared grid may be selected in the usual manner to suit the printing requirements. In general, this ratio is between 1:2.5 and 1:4. The shape of the wells, when viewed from above, is immaterial; they may be square, rectangular or some other shape.

Suitable photo-sensitive materials for layer S which are soluble in a developer solution but become sparingly soluble or insoluble therein when exposed to light are those known in the art. Such materials include photo-sensitive systems such as have been used for a long time in photomechanical reproduction processes, e.g., chromatesensitizing colloids based on gelatine, fish glue, albumin, casein, starch or polyvinyl alcohol.

Other suitable photo-sensitive systems are those whose components contain ethylenically unsaturated carbon double bonds and dimerize or polymerize on exposure. For example, the cinammic acid derivatives of polystyrene of polyvinyl alcohol may be used with success. Mixtures of this kind are described, for example, in U.S. Pat. No. 2,725,372 and German Pat. No. 1,079,453. Other suitable materials for the present process include unsaturated, soluble linear polyamides containing reactive stilbene units in the molecule (see for example U.S. Pat. No. 2,997,391 and U.K. Pat. Nos. 875,377 and 862,276).

Finally, a large number of photo-sensitive coating materials are included in the photopolymerizable systems such as are mentioned, for example, in German Pat. Nos. 1,138,320 and 1,140,081 and Belgian Pat. Nos. 684,502; 685,013; 687,678; 695,700 and 711,802. These mixtures become sparingly soluble or insoluble in the developer solutions due to radiation-induced polymerization of ethylenically unsaturated monomers which polymerize under the action of light in the presence of suitable photopolymerization initiators and preferably in the presence of polymers (cellulose derivatives, soluble polyamides, etc.) and thus make the entire system sparingly soluble or completely insoluble in the developer solution. Suitable polymers for the polymer/monomer mixtures are the solid, solvent-soluble, synthetic and semi-synthetic polymers which are known or commonly used in the manufacture of photopolymerizable coatings, in particular in the manufacture of relief printing plates, for example the polymers listed in U.S. Pat. No. 2,760,863. Specific examples thereof are vinyl polymers, such as polyvinyl chloride, vinylidene chloride polymers, copolymers of vinyl chloride and vinyl esters of monocarboxylic acids having from two to 11 carbon atoms and optionally vinyl alcohol, polymers of major amounts of olefinically unsaturated carboxylic acis having from three to five carbon atoms and/or their esters and/or amides, e.g., acrylic acid, methacrylic acid and their esters with alkanols of from one to 12 carbon atoms, such as acrylamide or methacrylamide. Also suitable are polymers based on styrene or vinyl esters of monocarboxylic acids having from two to 11 carbon atoms, such as vinyl acetate and vinyl chloroacetate. Other suitable polymers are those based on methacrylates and acrylates of aliphatic diols and polyols, such as ethylene glycol, 1,4-butanediol and glycerol. Finally, soluble cellulose derivatives, polyesters and polyethers may also be used.

Particularly suitable polymers are linear synthetic polyamides which contain recurring amide groups in the main chain of the molecule and which are soluble in conventional organic, especially alcoholic, solvents (as developer solutions). Of these, copolyamides are preferred which are soluble in conventional solvents or solvent mixtures, such as lower aliphatic alcohols, alcohol/water mixtures or mixtures of alcohols with other solvents such as benzene/alcohol/water mixtures, or which are soluble in ketones, esters or aromatic hydrocarbons. Examples of such copolyamides are those which have been prepared in a conventional manner by polycondensation or polymerization of two or more lactams containing from 5 to 13 ring members. Examples of such lactams are pyrrolidone, caprolactam, enantholactam, capryllactam, laurolactam or corresponding C-substituted lactams such as C-methyl-ε-caprolactam, ε-ethyl-ε-caprolactam and σ-ethylenantholactam. Instead of the lactams themselves, the amino-carboxylic acids on which they are based may be polycondensed. Other suitable copolyamides are polycondensation products of salts of the diamine/dicarboxylic acid type, prepared from at least three polyamide-forming starting materials. Preferred suitable dicarboxylic acids and diamines for this purpose are aliphatic dicarboxylic acids having from four to 20 carbon atoms, such as adipic acid, suberic acid, sebacic acid, dodecanedicarboxylic acid and corresponding substitution products such as α,α-diethyladipic acid, α-ethylsuberic acid, heptadecanedicarboxylic acid-(1,8) or heptadecanedicarboxylic acid-(1,9) or mixtures thereof, and dicarboxylic acids containing aliphatic or aromatic ring systems. Particularly suitable diamines are aliphatic or cycloaliphatic diamines having two primary and/or secondary amino groups, particularly those having from four to 20 carbon atoms, such as pentamethylene diamine, hexamethylene diamine, heptamethylene diamine, octamethylene diamine or C-and/or N-substituted derivatives of such amines, for example N-methyl-N'-ethylhexamethylene diamine, 1,6-diamino-4-methylhexane, 4,4'-diaminodicyclohexylmethane and 2,2-(4,4'-diaminodicyclohexyl)-propane, as well as aromatic diamines such as m-phenylene diamine, m-xylylene diamine and 4,4'-diaminodiphenylmethane. In all of the above starting materials, the bridging groups between the two carboxylic acid groups or amino groups may be optionally interrupted by heteroatoms such as oxygen, nitrogen or sulfur atoms. Particularly suitable copolyamides are those which have been prepared by cocondensation of a mixture of one or more lactams, in particular caprolactam, and at least one salt of a dicarboxylic acid and a diamine, for example ε-caprolactam, hexamethylenediammonium adipate and 4,4'-diaminodicyclohexylmethane adipate.

Suitable monomers for use in the preferably solid photo-sensitive material for layer (S) are compounds which contain photopolymerizable olefinically unsaturated double bonds and which are compatible to the extent of at least 20 to 50 percent by weight with the polymers which may optionally be included in the mixture. The bulk of the monomers used, preferably from 70 to 100 percent by weight of the total amount of monomers used, should contain more than one photopolymerizable olefinic double bond, provided that the polymers co-employed are not polyolefinically unsaturated, e.g., polycinnamates and unsaturated polyesters. Very suitable monomers having at least two polymerizable olefinic double bonds and which are particularly suitable for mixing with soluble linear polyamides are those which contain, in addition to their double bonds, amide groups such as amides derived from acrylic acid and/or methacrylic acid. Specific examples are alkylene-bis-(meth)acrylamides, such as methylene-bis-acrylamide and methylene-bis-methacrylamide, the bis-acrylamides and bis-methacrylamides of aliphatic, cycloaliphatic and aromatic diamines or polyamines of from two to 12 carbon atoms, for example of ethylene diamine, propylene diamine, butylene diamine, pentamethylene diamine, hexamethylene diamine, heptamethylene diamine, octamethylene diamine, xylylene diamine, as well as polyamines and other diamines which may, if desired, be branched or interrupted by heteroatoms such as oxygen, nitrogen or sulfur atoms. Highly suitable are diethers of 1 mole of an aliphatic diol and 2 moles of N-methylol(meth) acrylamide. Photopolymerizable monomers which are also very suitable are those which contain, optionally in addition to amide groups, urethane groups or urea groups, such as the reaction products of mono(meth)acrylates of aliphatic diols with diisocyanates or the corresponding reaction products of mono(meth)acrylamides of diamines with diisocyanates. Further examples of suitable nitrogen-containing monomers are triacryloyl perhydrotriazine and triallyl cyanurate. Also suitable are the diacrylates, triacrylates and tetraacrylates and the dimethacrylates, trimethacrylates and tetramethacrylates of dihydric or polyhydric alcohols and phenols, e.g., di- and triethylene glycol di(meth)acrylates. However, the use of difunctional or polyfunctional polymerizable monomers is not limited to the selection given above. It also includes other monomers having at least two polymerizable double bonds provided that these are compatible to the extent of at least 20 to 50 percent with the polymers optionally included in the mixture, which can be readily determined by simple experiment.

In addition to the monomers having more than one polymerizable olefinic double bond, minor amounts, preferably amounts of less than 30 percent by weight of the total amount of monomers, of monomers having only one polymerizable olefinic double bond may be used, examples being aromatic hydrocarbons, e.g., styrene and vinyl toluene, acrylamides or methacrylamides and their substitution products, e.g., N-methylol(meth)acrylamide, or their ethers or esters or monoesters of olefinically unsaturated carboxylic acids having from three to five carbon atoms and aliphatic diols or polyols, e.g., mono(methyl)acrylates of ethylene glycol, diethylene glycol, triethylene glycol, glycerol, 1,1,1-trimethylolpropane and 1,4-butanediol. Their choice is governed by the above stipulations.

The monomers having only one photopolymerizable olefinic double bond may however by used alone when the polymers in the layer have a plurality of olefinically unsaturated copolymerizable double bonds.

Very suitable photocrosslinkable mixtures for layer S contain, in substantially homogeneous admixture with each other, from 10 to 50 percent, particularly from 20 to 40 percent, by weight of monomers and from 90 to 50 percent, particularly from 80 to 60 percent, by weight of solid polymers such as soluble polyamides. Preferred mixtures are solid and remain non-tacky even when heated to elevated temperatures, for example to 50° to 60°C.

Advantageously, the monomer-containing photocrosslinkable materials may also contain photoinitiators, i.e., compounds which decompose with the formation of free radicals under the action of light or radiation and thus initiate polymerization of the monomers. Examples are vicinal ketaldonyl compounds such as diacetyl, benzil, $\alpha$-ketaldonyl alcohols such as benzoin, acyloin ethers such as benzoin methyl ether and benzoin isopropyl ether, $\alpha$-substituted aromatic acyloins such as $\alpha$-methylbenzoin. The photoinitiators are used in the usual amounts, advantageously in amounts from 0.01 to 10 percent, preferably from 0.01 to 3 percent, by weight based on the photocrosslinkable material. A detailed list and description of the photoinitiators and photocrosslinkable materials which can be used is given by J. Kosar, "Light-sensitive Systems," John Wiley & Sons, New York, 1965.

The photocrosslinkable layer S may also contain small amounts of polymerization inhibitors to prevent a thermal polymerization in monomer-polymer systems, e.g., hydro-quinone, p-methoxyphenol, p-quinone, methylene blue, $\beta$-naphthol, phenols or salts of N-nitroso-cyclohexylhydroxylamine. These inhibitors are generally used in amounts of from 0.01 to 2.0 percent, preferably in amounts of from 0.05 to 1 percent, by weight based on the photocrosslinkable material.

In order to achieve an exact linear dependence of the well depths on the tone values of the positive and to achieve particularly good reproducibility, it is advantageous to ensure a sufficiently high optical density in the photocrosslinkable layer S in the wavelength range in which photocrosslinking is effected. In the case of the industrially important systems this is achieved by the addition of actinic-light-absorbing compounds which do not disturb the photopolymerization reaction, i.e., compounds which have an absorbing action in the region of actinic light and thus render the radiation in this region photochemically ineffective. These compounds should as far as possible not have any effect on the photopolymerization reaction, i.e., they should not act as initiators, inhibitors or chain transfer agents. Their object is to bring about as sharp a drop as possible in the intensity of light within the photocrosslinkable layer during exposure because it has been found that this gives the best results as regards accuracy and reproducibility of the printed copies. A large number of conventional UV absorbers for plastics are suitable for this purpose, for example those described by R. A. Coleman, J. A. Weicksel, Modern Plastics, Vol. 36, No. 12, pages 117–121 and 198–200 (1959) and H. Gysling and H. J. Heller, Kunststoffe, 51, 13 to 17 (1961). Examples of suitable compounds are o-hydroxybenzophenones or bisphenols which are substituted in the position adjacent to the hydroxy groups, such as 2,2'-dihydroxy-4-methoxybenzophenone and bis(2-hydroxy-3-tert-butyl-5-methylphenyl) methane. Very suitable are dinitro and trinitro compounds such as 2,4-dinitrophenol and organic-solvent-soluble metal complex dyes and phthalocyanine dyes which are generally referred to in the Color Index as "solvent dyes." The metal complex dyes are preferably 1:1 or 1:2 complexes of azo or azomethine dyes having o-carboxy-o'-hydroxy or o-amino-o'-hydroxy groups, particularly, o,o'-di-hydroxy groups. Particularly suitable metals are chromium and cobalt. Suitable dyes are described in British Pats. 944,409 and 981,050. Preferred phthalocyanines are copper-containing compounds. Particularly suitable dyes are disclosed in U.S. Pat. application Ser. No. 6301 filed on Jan. 27, 1970 and now U.S. Pat. No. 3,674,494.

The said compounds are usually added to the photocrosslinkable layer S in an amount of 0.01 to 20 percent by weight, preferably in an amount of 0.1 to 10 percent by weight, based on the photocrosslinkable material; however, care should be taken to ensure that they are substantially uniformly distributed throughout the layer. The amount of additive depends in particular on its absorptivity and on the thickness of the layer. In many cases an addition of 0.1 to 1 percent by weight of the photocrosslinkable material is sufficient. Those compounds are preferred which have good compatability with the other materials in the layer.

Exposure of the gravure printing plates is effected using light sources suited to the sensitivity of the photocrosslinkable material used. In general, light sources emitting a high proportion of high-energy short-wave radiation are particularly suitable. The light sources commonly used in reproduction processes, for example carbon arc lamps, xenon lamps, mercury vapor lamps, fluorescent tubes and photofloods, may be successfully used for the process of the invention.

After exposure through the screen grid, the exposed blank plate is treated with developer solution, i.e., washed out, in any convenient manner, for example by spraying the developer solution onto the soluble areas, brushing or rubbing out said areas with the solution or agitating the exposed printing plate in the solution.

Suitable developer solutions or washout solvents are those solvents or solvent mixtures in which the unexposed photo-sensitive material exhibits good solubility, whereas exposure of the photo-sensitive materials leads to a strong reduction or complete loss of solubility in said solvents. Examples of developer solutions are lower aliphatic alcohols, mixtures of alcohol with water and/or benzene, glycol ethers, glycol esters, aqueous and alcoholic caustic solutions. Suitable developer solutions for a given photo-sensitive material can be quickly determined by a few simple experiments. Treatment of the exposed gravure printing plates with developer solution, i.e., the washing out of the unexposed areas of layer S, is generally carried out at a temperature of about 10° to 40°C in the course of about 1 to 15 minutes, the temperature used depending on the vapor pressure of the developer used.

Figure 3:
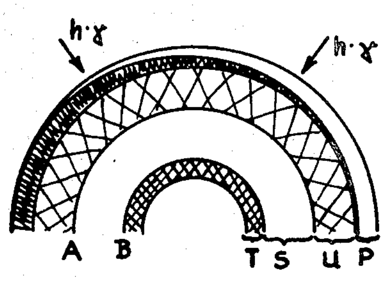

According to the invention the photocrosslinkable layer S is first exposed through a continuous tone positive P (cf. FIGS. 1 and 3) until the photocrosslinkable material beneath the completely transparent areas of the positive is crosslinked through to the substrate T. The exposure time depends on the type of material used for the photocrosslinkable layer and in particular on the latter's optical density. The exposure time can be readily determined by a few simple experiments. In the case of conventional materials it is between 3 and 30 minutes. The layer S is then laminated in a conventional manner to a base D so that the front side A originally facing the positive faces the base D. Typical bases are metal cylinders or sheets. To achieve the desired bond between layer S and base D, it is advantageous to apply a thin layer of an adhesive, for example a polyurethane two-component adhesive, such as is described in U.K. Pat. No. 1,244,202, to the base. Following lamination, the dimensionally stable substrate T is usually removed and the screen grid R is brought into contact with side B. Layer S is then re-exposed through the screen to produce the network of doctor lines. Here again, the photocrosslinkable layer is exposed until the photocrosslinkable material beneath the completely transparent areas of the screen grid is crosslinked for its entire depth.

The thickness of the photocrosslinkable layer corresponds to the depth of the wells required to give the deepest tones. This depth is normally in the range 10 to 100 $\mu$, preferably in the range from about 20 to 60 $\mu$. However, depths outside the first range may be used if desired, particularly when the printing inks to be used have special properties with regard to their viscosity or color saturation.

Figure 4:
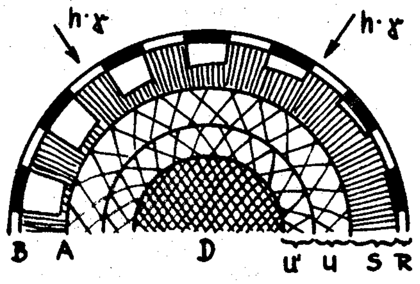

The process of the invention makes possible the production of gravure plates in which the tone values, as in the case of intaglio plates of the conventional type, comprise wells, the depths of which surprisingly are proportional to the optical density of the positive. Moreover, a special embodiment enables another problem encountered in gravure printing to be overcome: as is well known, a large number of cylinders of varying diameter are required, which would mean that, when photocrosslinkable layers are used as the printing surfaces, a correspondingly large number of films of varying thickness would have to be kept in stock. This problem can be solved by providing — prior to lamination of layer S or layers S and U which have been exposed through the continuous tone positive - cylinder D (cf. FIG. 4), which may be coated with a thin layer of adhesive, with an approximately 5 to 500, preferably 10 to 100, $\mu$ thick layer U' of plastics material which is insoluble in the developer solution or has been insolubilized and which can be firmly bonded to photocrosslinkable layer S or upper layer U. The said problem can also be substantially solved by exposing through a continuous tone positive P (cf. FIG. 3) a photocrosslinkable layer S to which there has been firmly bonded an approximately 5 to 100, preferably 10 to 50, $\mu$ thick light-transmitting upper layer U of plastics material that is insoluble in the developer solution or has been insolubilized, from front side A of layer S through layer U and laminating the firmly adhering layers S and U to a base D, which may be provided with a coating of adhesive, so that the upper layer U originally facing the positive faces the base. It is preferred to use both layer U and layer U'. The same materials can be used for layers U and U' as for the photocrosslinkable layer S except that they must not contain any ultraviolet-absorbing compounds. It is however also possible to use chemically similar materials for these layers provided that they can be firmly bonded to layer S and thermally or photochemically crosslinked. The use of crosslinked layers U and U' has the advantage that a relatively thick shell is formed which, in the case of a used cylinder, can be readily ground down to the desired diameter to make the cylinder re-usable, and which, when only one thickness of photocrosslinkable film S is available, can be ground down to a greater or lesser degree to give a very large number of cylinders of any required diameter.

The invention is further illustrated by the following Examples in which parts are by weight unless otherwise stated.

EXAMPLE 1

There is applied to a 100 $\mu$ polyethylene terephthalate film, as substrate T, a 40 $\mu$ photocrosslinkable layer S having the following composition:

64 parts of a copolyamide which is soluble in aqueous alcohol and prepared from approximately equal parts of hexamethylenediamine adipate, 4,4'-diaminodicyclohexylmethane adipate and $\epsilon$-caprolactam;

27 parts of the diether of 1 mole of ethylene glycol and 2 moles of N-methylolacrylamide;

2 parts of $\alpha$-methylol benzoin methyl ether;

8 parts of ethylene glycol;

0.2 part of the sodium salt of N-nitrosocyclohexylhydroxylamine; and 0.75 part of the 1:2 chromium mixed complex of the azo dyes of 0.5 mole each of 4-nitro-2-aminophenol and anthranilic acid and 1 mole of β-naphthol.

These components are in the form of an intimate mixture.

The photocrosslinkable layer is then exposed for 15 minutes through a continuous tone step wedge (positive P). The light source used is a bank of fluorescent tubes emitting a high proportion of UV light and arranged at a distance of 3 cm from the layer. Afterwards the layer is laminated, using alcohol, to a base D made of sheet steel 0.3 mm in thickness and provided with a layer of polyurethane adhesive so that side A of the layer S faces the adhesive coating. The polyethylene terephthalate film T is removed and the layer S is then re-exposed from side B through a screen grid R (70 lines/cm; line-to-well width ratio 1:3) to give the network of doctor lines. The soluble portions of the layer S are removed with alcohol. After drying, an intaglio plate is obtained in which the tone values comprise wells, the depths of which are proportional to the optical density of the step wedge.

EXAMPLE 2

There are applied to a 100 μ polyethylene terephthalate film, as substrate T, a 35 μ photocrosslinkable layer S having the same composition as in Example 1 and, on top thereof, a 20 μ photoinsolubilized layer U having the same composition as layer S but no chromium complex dye. The photocrosslinkable layer S is then exposed for 12 minutes through a continuous tone step wedge (positive P) from side A, i.e., through the crosslinked layer U, using the equipment described in Example 1. Afterwards the exposed sheet is laminated to an aluminum cylinder (base D) via a 50 μ photoinsolubilized layer U' which has the same composition as layer U and is bonded to the said cylinder with a polyurethane adhesive. Substrate T is then removed, layer S is re-exposed from side B through a screen grid R and the unexposed areas are washed out with alcohol. Here again, a gravure cylinder is obtained in which the tone values comprise wells, the depths of which are proportional to the optical density of the step wedge. When used on a gravure press, the plate gives very good printed copies.

EXAMPLE 3

There are applied to a 100 μ polyethylene terephthalate film, as substrate T, a 40 μ photocrosslinkable layer S having the following composition:

100 parts of the copolyamide specified in Example 1;
8 parts of triethylene glycol bisacrylamide;
20 parts of m-xylylene bisacrylamide;
30 parts of N-methylolacrylamide;
0.1 part of the sodium salt of N-nitrosocyclohexylhydroxylamine; and
0.5 part of 2,4-dinitrophenol, and, on top thereof, a 30 μ photoinsolubilized layer U having the same composition as layer S but without any 2,4-dinitrophenol.

Exposure and further processing are the same as in Example 2. The gravure cylinder obtained gives very good printed copies.

EXAMPLE 4

The procedure of Example 3 is followed except that 7.5 parts of 2,2-dihydroxybenzophenone is substituted for 0.5 part of 2,4-dinitrophenol in the photocrosslinkable layer S. The printed copies obtained with the resulting gravure cylinder are approximately of the same quality as those obtained in Example 3.

We claim:

1. A process for the production of gravure printing plates by exposing through a continuous tone positive and a screen grid a 10 to 100 micron thick developer-soluble layer (S) applied to a substrate, said layer (S) comprising photosensitive components having ethylenically unsaturated carbon double bonds through which said components dimerize or polymerize to form a developer-insoluble crosslinked state on exposure to actinic light and whereby unexposed developer-soluble portions of the layer can be washed out with developer, which comprises exposing said layer (S) through said continuous tone positive until the photocrosslinkable material beneath the completely transparent areas of said positive is crosslinked through to said substrate, subsequently laminating said layer (S) to a base so that the front side originally facing said positive faces said base, re-exposing said layer (S) from the rear side, if necessary after removal of said substrate, through said screen grid to give the network of doctor lines, and then washing out the unexposed developer-soluble portions of said layer from said rear side with said developer.

2. A process as claimed in claim 1, wherein said layer (S) contains, finely dispersed therein, 0.05 to 20 percent by weight of actinic-light-absorbing compounds which do not disturb the photopolymerization reaction.

3. A process as claimed in claim 1, wherein said layer (S) to which there has been firmly bonded a 5 to 100 μ thick light-transmitting upper layer (U) of plastics material that is insoluble in said developer solution or has been insolubilized is exposed through said continuous tone positive from its front side through said upper layer (U), and said firmly adhering layer (S) and upper layer (U) are laminated to said base so that said upper layer (U) originally facing said positive faces said base.

4. A process as claimed in claim 1, wherein said base — prior to lamination of said layer (S) — bears an approximately 5 to 500 μ thick later (U') of plastics material which is insoluble in said developer solution or has been insolubilized and which can be firmly bonded to said layers (S).

5. A process as claimed in claim 3, wherein said upper layer (U) consists of a crosslinked plastics material whose chemical composition is substantially the same as or similar to that of said layer (S) and which can be firmly bonded to the latter.

6. A process as claimed in claim 4, wherein said approximately 5 to 500 μ thick layer (U') consists of a crosslinked plastics material whose chemical composition is substantially the same as or similar to that of said layer (S) and which can be firmly bonded to the latter.

7. A process as claimed in claim 4, wherein said approximately 5 to 500 μ thick layer (U') consists of a crosslinked plastics material whose chemical composition is the same as that of said upper (U) layer and which can be firmly bonded to the latter.

8. A process as claimed in claim 3 wherein said base — prior to the lamination of said layer (S) and said upper layer (U) which have been exposed through said continuous tone positive — bears an approximately 5 to 500 micron thick layer (U) of plastics material which is insoluble in said developer solution or has been insolubilized and can be bonded to said layer (S) or said upper layer (U).

* * * * *

UNITED STATES PATENT OFFICE

CERTIFICATE OF CORRECTION

Patent No. 3,770,435 Dated November 6, 1973

Inventor(s) Otto Volkert & Manfred Zuerger

It is certified that error appears in the above-identified patent and that said Letters Patent are hereby corrected as shown below:

First page, left-hand column, eleventh line, insert
-- 30 Foreign Application Priority Data
December 12, 1970 Germany . . . . . P 20 61 287.7 --.

Column 1, line 66, "corsslinked" should read -- crosslinked --.

Column 2, line 22, "fron" should read -- from --.

Column 2, lines 23-24, "alyers" should read -- layers --.

Column 3, line 5, "of " should read -- or --.

Column 3, line 39, "acis" should read -- acids --.

Signed and sealed this 15th day of October 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
U.S. GOVERNMENT PRINTING OFFICE : 1969 O—366-334